(12) United States Patent
Kondo

(10) Patent No.: US 11,075,139 B2
(45) Date of Patent: Jul. 27, 2021

(54) HEAT RADIATION STRUCTURE, ELECTRONIC DEVICE AND MANUFACTURING METHOD OF HEAT RADIATION STRUCTURE

(71) Applicant: FUJITSU LIMITED, Kawasaki (JP)

(72) Inventor: Daiyu Kondo, Atsugi (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 16/545,454

(22) Filed: Aug. 20, 2019

(65) Prior Publication Data

US 2020/0083140 A1 Mar. 12, 2020

(30) Foreign Application Priority Data

Sep. 12, 2018 (JP) .............................. JP2018-170659

(51) Int. Cl.
| | | |
|---|---|---|
| *H01L 23/373* | (2006.01) | |
| *H01L 21/48* | (2006.01) | |
| *F28F 13/18* | (2006.01) | |
| *H01L 23/00* | (2006.01) | |

(52) U.S. Cl.
CPC .......... *H01L 23/3735* (2013.01); *F28F 13/18* (2013.01); *H01L 21/4871* (2013.01); *H01L 24/73* (2013.01); *H01L 2224/73265* (2013.01)

(58) Field of Classification Search
CPC ....... H01L 2224/73265; H01L 21/4871; H01L 23/3735; H01L 24/73
USPC ........................................ 257/703; 438/125
See application file for complete search history.

(56) References Cited

U.S. PATENT DOCUMENTS

| 2016/0211431 A1* | 7/2016 | Yang ..................... H01L 31/049 |
| 2020/0181393 A1* | 6/2020 | Kawate ................... C08L 63/00 |

FOREIGN PATENT DOCUMENTS

| JP | 2010-40883 A | 2/2010 |
| JP | 2010-253730 A | 11/2010 |

* cited by examiner

*Primary Examiner* — Long K Tran
(74) *Attorney, Agent, or Firm* — Westerman, Hattori, Daniels & Adrian, LLP

(57) ABSTRACT

A heat radiation structure includes: a hexagonal boron nitride layer; and a turbostratic structure boron nitride layer provided on a first surface of the hexagonal boron nitride layer.

15 Claims, 16 Drawing Sheets

HEAT RADIATION STRUCTURE, ELECTRONIC DEVICE AND MANUFACTURING METHOD OF HEAT RADIATION STRUCTURE

CROSS-REFERENCE TO RELATED APPLICATION

This application is based upon and claims the benefit of priority of the prior Japanese Patent Application No. 2018-170659, filed on Sep. 12, 2018, the entire contents of which are incorporated herein by reference.

FIELD

A certain aspect of embodiments described herein relates to a heat radiation structure, an electronic device and a manufacturing method of the heat radiation structure.

BACKGROUND

There are known various heat radiation structures that are capable of favorably radiating heat generated in an electronic device and have insulation performance. For example, Japanese Patent Application Publication No. 2010-40883 (hereinafter referred to Patent Document 1) discloses a heat radiation sheet in which hexagonal boron nitride layer is formed on a surface of a graphite sheet.

SUMMARY

According to an aspect of the present invention, there is provided a heat radiation structure including: a hexagonal boron nitride layer; and a turbostratic structure boron nitride layer provided on a first surface of the hexagonal boron nitride layer.

According to another aspect of the present invention, there is provided an electronic device including: an electronic component; and a heat radiation structure thermally connected to the electronic component, wherein the heat radiation structure includes: a hexagonal boron nitride layer; and a turbostratic structure boron nitride layer provided on a first surface of the hexagonal boron nitride layer.

According to another aspect of the present invention, there is provided a manufacturing method of a heat radiation structure including: forming a metal layer on a support member; forming a hexagonal boron nitride layer on the metal layer; and forming a turbostratic structure boron nitride layer on the hexagonal boron nitride layer.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

A hexagonal boron nitride layer has a layered structure in which board-shaped structures, in which six-membered cyclic carbonates including boron atoms and nitrogen atoms are two-dimensionally coupled, are regularly stacked. Bonding in the board-shaped structures is strong. Therefore, the board-shaped structures have favorable heat conductivity. However, interlayer bonding strength between the board-shaped structures is small. Therefore, the heat conductivity is not favorable. Therefore, there is room for improving the heat radiation of the heat radiation sheet disclosed in Patent Document 1.

First Embodiment

A description will be given of embodiments on the basis of drawings.

Figure 1:
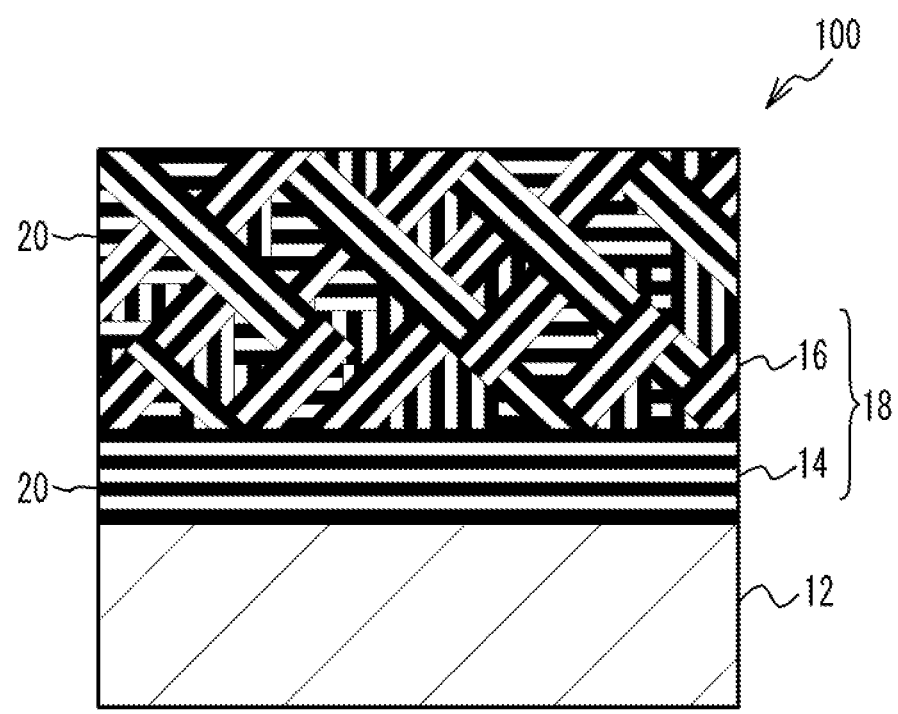
FIG. 1 illustrates a cross sectional view of a heat radiation structure in accordance with a first embodiment.

FIG. 1 illustrates a cross sectional view of a heat radiation structure in accordance with a first embodiment. FIG. 1 schematically illustrates a board-shaped structure including a hexagonal boron nitride layer and a turbostratic structure boron nitride layer. As illustrated in FIG. 1, a heat radiation structure 100 includes a metal layer 12 and a boron nitride layer 18 (hereinafter referred to as a BN layer 18). The boron nitride has high thermal conductivity which is approximately the same as that of diamond. The BN layer 18 includes the hexagonal boron nitride layer 14 (hereinafter referred to as an h-BN layer 14) and a turbostratic structure boron nitride layer 16 (hereinafter referred to as a t-BN layer 16).

The metal layer 12 is, for example, a layer made of iron (Fe), cobalt (Co), nickel (Ni), gold (Au), silver (Ag), or platinum (Pt) or a layer made of an alloy including at least one of the metals. In the first embodiment, as an example, the metal layer 12 is an iron (Fe) layer. A thickness of the metal layer 12 is, for example, approximately 50 nm to 1000 nm.

The h-BN layer 14 contacts one of main faces of the metal layer 12. The h-BN layer 14 is fine ceramic having a layered structure like graphite and has insulation performance. In the h-BN layer 14, the board-shaped structure 20 has a structure in which a plurality of six-membered cyclic structures, in which boron atoms and nitrogen atoms are alternately covalently bonded, are two-dimensionally coupled. The h-BN layer 14 has a layered structure in which the board-shaped structures 20 are regularly stacked by van Der Waals bonding. The b-BN layer 14 has a layered structure in which a few (about one layer to 50 layers) of the board-shaped structures 20 are stacked on one of main faces of the metal layer 12. In the h-BN layer 14, ab-faces are aligned in parallel with the main face of the metal layer 12, and a c-axis is vertical to the main face of the metal layer 12.

The binding of the board-shaped structure 20 in the h-BN layer 14 is strong, because the binding is a covalent binding. On the other hand, each binding between each of the board-shaped structures 20 is van der Waals hinging. Therefore, the h-BN layer 14 has anisotropy with respect to thermal conduction. That is, the h-BN layer 14 achieves favorable thermal conductivity in a plane direction of the board-shaped structure 20. However, the h-BN layer 14 does not have favorable thermal conductivity in a thickness direction of the layered structure.

The t-BN layer 16 sandwiches the h-BN layer 14 with the metal layer 12 and contacts the h-BN layer 14. The t-BN layer 16 has insulation performance as well as the h-BN layer 14. The t-BN layer 16 has a polycrystalline structure in which a plurality of units are randomly stacked without regularity. The unit has a structure in which one or more of the board-shaped structures 20 are regularly stacked. That is, in the t-BN layer 16, orientation of the board-shaped structures 20 is uneven. Therefore, the thermal conductivity of the t-BN layer 16 can be favorable in any of the three dimensional directions.

A thickness of the BN layer 18 is, for example, approximately the same as that of the metal layer 12 or more than that of the metal layer 12. The thickness of the BlN layer 18 is approximately 50 nm to 1000 nm. A thickness of the t-BN layer 16 is, for example, more than that of the h-BN layer 14.

Figure 2A:
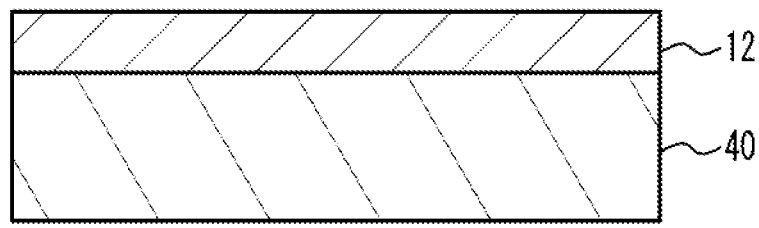
FIG. 2A to FIG. 2C illustrate a cross sectional view fix describing a manufacturing method of a heat radiation structure of a first embodiment.
Figure 2B:
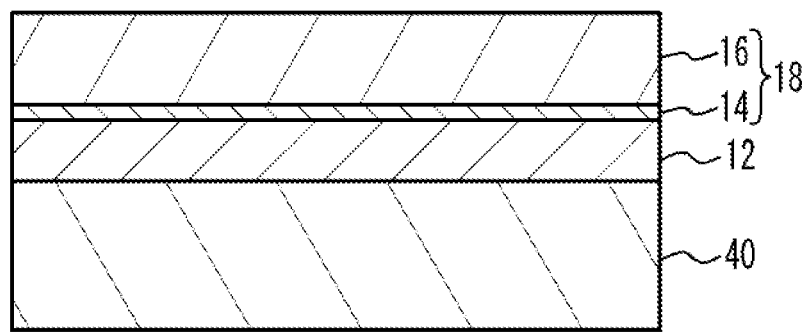
Figure 2C:
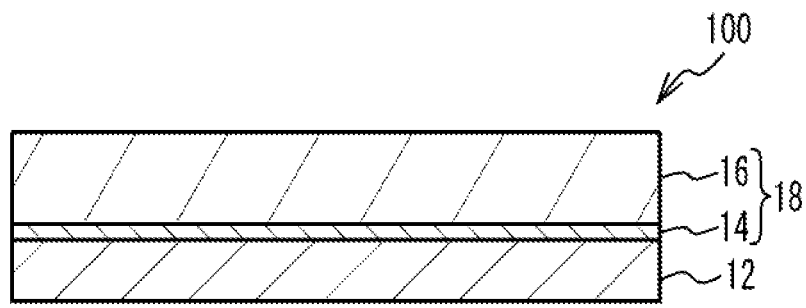

FIG. 2A to FIG. 2C illustrate a cross sectional view for describing a manufacturing method of the heat radiation structure of the first embodiment. In FIG. 2A to FIG. 2C, the board-shaped structure 20 is not illustrated. In the following figures, the board-shaped structure 20 is omitted. As illustrated in FIG. 2A, the metal layer 12 is formed on a main face of a support member 40 such as a silicon substrate with an oxide film, by a sputtering method. For example, an iron (Fe) target is used as a target. Argon (Ar) gas is used as sputtering gas. A temperature of a substrate is 500 degrees C. And, the metal layer 12 is formed on the main face of the support member 40. A thickness of the metal layer 12 is, for example, 50 nm to 1000 nm. The metal layer 12 may be formed by another method other than the sputtering method such as an electron beam vapor deposition method or a molecular beam epitaxy method.

A ground layer may be formed between the support member 40 and the metal layer 12. The ground layer may be a film of molybdenum (Mo), titanium (Ti), hafnium (Hf), zirconium (Zr), niobium (Nb), vanadium (V), tantalum nitride (TaN), titanium silicide (TiSi$_x$), aluminum (Al), aluminum oxide (Al$_2$O$_3$), titanium oxide (TiO$_x$), tantalum (Ta), tungsten (W), copper (Cu), gold (Au) or platinum (Pt), or a film of an alloy including at least one of the metals, or a film of oxide or a film of nitride.

As illustrated in FIG. 2B, the BN layer 18 is formed on the main face of the metal layer 12 which is an opposite to the support member 40, with use of a sputtering method. For example, an h-BN target is used as a target. Mixed gas of Argon (Ar) gas and nitrogen (N) gas is used as sputtering gas. A temperature of a substrate is 500 degrees C. Under this condition, the BN layer 18 is formed on the main face of the metal layer 12. A thickness of the BN layer 18 is, for example, approximately 50 nm to 1000 nm. Iron (Fe) included in the metal layer 12 acts as a catalyst of h-BN during the formation of the BN layer 18. Thus, the h-BN layer 14 in which a few of the board-shaped structures 20 are regularly stacked is formed. After that, the iron (Fe) included in the metal layer 12 is spaced from the metal layer 12. Therefore, the effect of iron (Fe) acting as a catalyst of the h-BN is reduced. Thus, the t-BN layer 16 having a polycrystalline structure in which the plurality of board-shaped structures 20 are randomly stacked without regularity is formed.

When the oxide film of the silicon substrate acting as the support member 40 is etched and removed with use of hydrofluoric or the like, the heat radiation structure 100 having the metal layer 12, the h-BN layer 14 and the t-BN layer 16 is peeled from the support member 40 as illustrated in FIG. 2C. The support member 40 is not limited to the silicon substrate with the oxide film. The support member 40 may be an insulation member, a semiconductor member or a metal member, when the support member 40 is a member with which the metal layer 12 can be peeled from the support member 40. Before removing the support member 40, the oxide film of the silicon substrate may be etched and removed after an organic material such as resist as a support member is coated on the t-BN layer 16.

Figure 3:
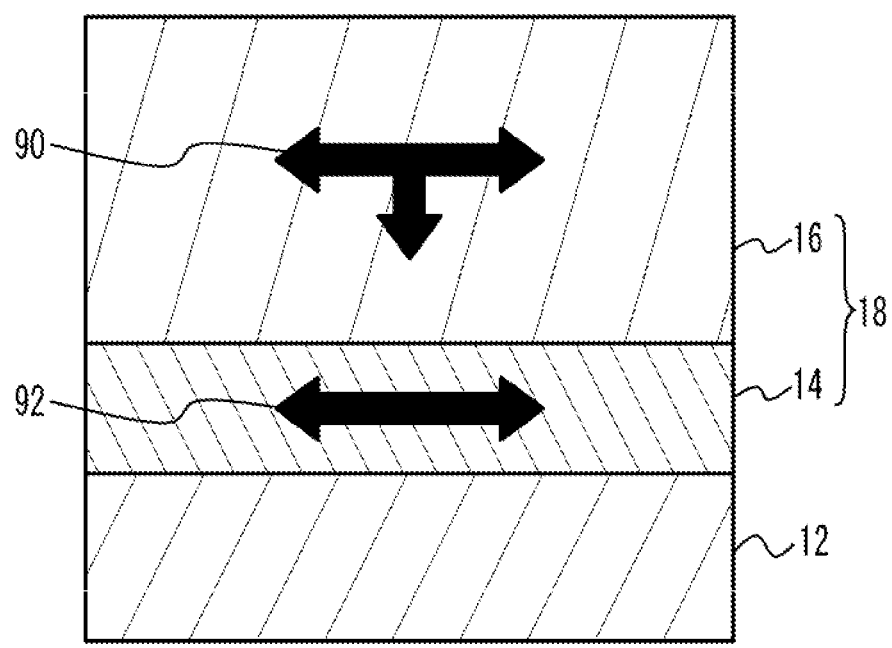
FIG. 3 illustrates an effect of a heat radiation structure of a first embodiment.

FIG. 3 illustrates an effect of the heat radiation structure of the first embodiment. The heat radiation structure 100 of the first embodiment has a structure in which the h-BN layer 14 is provided on the main face of the metal layer 12, and the t-BN layer 16 is provided on the main face of the h-BN layer 14 which is opposite to the metal layer 12. As mentioned above, heat conductivity of the t-BN layer 16 can be favorable in any of the three-dimensional directions. Therefore, as indicated by an arrow 90 in FIG. 3, in the t-BN layer 16, the heat can be radiated in any of the three-dimensional directions. On the other hand, the heat conductivity of the h-BN layer 14 is favorable in the in-plane direction of the board-shaped structure 20. Therefore, as indicated by an arrow 92 in FIG. 3, the heat is favorably radiated in a horizontal direction in the h-BN layer 14.

For example, in order to achieve favorable insulation performance, it is assumed that the BN layer 18 has a large thickness. In this case, the heat conductivity in the horizontal direction is favorable but the heat conductivity in the vertical direction is not favorable, when the BN layer 18 has only the h-BN layers 14. Therefore, as a whole, the BN layer 18 may not necessarily have favorable heat radiation performance. In contrast, the BN layer 18 may have favorable heat conductivity in any of the three-dimensional directions, when the BN layer 18 has only the t-BN layers 16. However, the board-shaped structures 20 are stacked without regularity. In this case, in accordance with the stacking condition, the heat radiation in the horizontal direction may be insufficient. On the other hand, the heat radiation of the three-dimensional directions is favorable in the t-BN layer 16 and the heat radiation in the horizontal direction in the h-BN layer 14 is secured, when the BN layer 18 has the h-BN layer 14 and the t-BN layer 16. It is therefore possible to improve the heat radiation performance of the BN layer 18 as a whole.

In this manner, in the heat radiation structure 100 of the first embodiment, the h-BN layer 14 is provided on the main face of the metal layer 12, and the t-BN layer 16 is provided on the main face of the h-BN layer 14 which is opposite to the metal layer 12. Thus, heat radiation toward three dimensional directions is favorable in the t-BN layer 16. And, heat radiation is certainly achieved toward a horizontal direction in the h-BN layer 14. It is therefore possible to improve the heat radiation performance.

In the first embodiment, as illustrated in FIG. 2A to FIG. 2C, the metal layer 12 is provided on the support member 40. The h-BN layer 14 is provided on the main face of the metal layer 12 which is opposite to the support member 40. The t-BN layer 16 is provided on the main face of the h-BN layer 14 which is opposite to the metal layer 12. Thus, the heat radiation structure 100 of which heat radiation performance is improved is obtained. It is preferable that the h-BN layer 14 and the t-BN layer 16 are formed by a continuous deposition without breaking the vacuum of the deposition device (for example, a sputtering device). In this case, increasing of a thermal resistance is suppressed at an interface between the h-BN layer 14 and the t-BN layer 16.

It is preferable that the metal layer 12 includes at least one of iron (Fe), cobalt (Co), nickel (Ni), gold (Au), silver (Ag), platinum (Pt) or an alloy thereof. This is because these metals act as a catalyst of the h-BN, and the h-BN layer 14 is easily formed on the main face of the metal layer 12.

It is preferable that the t-BN layer 16 is thicker than the h-BN layer 14. This is because even if the BN layer 18 is thick, the heat radiation toward the three dimensional directions are favorable and the heat radiation performance can be improved.

In the first embodiment, the h-BN layer 14 and the t-BN layer 16 are formed by a sputtering method. However, the h-BN layer 14 and the t-BN layer 16 may be formed by another method such as a CVD (Chemical Vapor Deposition) method, an electron beam vapor deposition method, or a molecular beam epitaxy method. The h-BN layer 14 and the t-BN layer 16 may be formed by the same method. Alternatively, the method for forming the h-BN layer 14 may be different from the method for forming the t-BN layer 16.

Here, results of insulation evaluation are described with respect to a sample 1 in which the boron nitride layer is formed by a sputtering method and a sample 2 in which the boron nitride layer is formed by a thermal CVD method.

In the sample 1, an iron (Fe) film having a thickness of 50 nm and a boron nitride layer having a thickness of 50 nm were continuously deposited on a sapphire substrate by a sputtering method without breaking vacuum of a sputtering device. An iron (Fe) target was used for the deposition of the iron (Fe) layer. An h-BN target was used for the deposition of the boron nitride layer. Sputtering gas was argon (Ar) gas when the iron (Fe) target was used. Mixed gas of argon (Ar) and nitrogen ($N_2$) gas was used when the h-BN target was used. A gas flow ratio of Ar gas and $N_2$ gas was 4:1. A temperature of the substrate was 500 degrees C. The boron nitride layer was structured with a hexagonal boron nitride layer and a turbostratic boron nitride layer by a catalyst function of iron (Fe) in the iron (Fe) layer.

A surface of the boron nitride layer of the sample 1 was observed by an atomic force microscope. A value of Ra (arithmetic average roughness) which was one of indices of surface roughness was approximately 4.9 nm. Insulation breakdown strength of the boron nitride layer of the sample 1 was evaluated. The insulation breakdown strength was approximately 40 MV/cm.

In the sample 2, an iron (Fe) film having a thickness of 100 nm was deposited on a sapphire substrate by a sputtering method. The sputtering condition of the iron (Fe) layer was the same as that of the sample 1. Then, a boron nitride layer having a thickness of 50 nm was deposited by a thermal CVD method. Raw material gas was ammonia and diborane. Dilution gas was argon and hydrogen. A flow amount of ammonia and diborane was 10 sccm. A flow amount of argon was 4000 sccm. A flow amount of hydrogen was 500 sccm. A temperature of the substrate was 1000 degrees C. Gas pressure was $5.0 \times 10^4$ Pa. The boron nitride layer was structured with a hexagonal boron nitride layer by a catalyst function of iron (Fe) in the iron (Fe) layer.

Insulation breakdown strength of the boron nitride layer of the sample 2 was evaluated. The insulation breakdown strength was equal to or more than 100 MV/cm.

From the evaluation results of the insulation breakdown strength of the sample 1 and the sample 2, it may be possible to improve the film quality of the boron nitride layer by forming the boron nitride layer by a CVD method. On the other hand, the film quality of the boron nitride layer formed by a sputtering method may be degraded, compared to that of the boron nitride layer formed by the CVD method. However, the boron nitride layer formed by the sputtering method may have sufficient insulation breakdown strength. It is possible to improve the productivity when the boron nitride layer is formed by the sputtering method.

Second Embodiment

Figure 4:
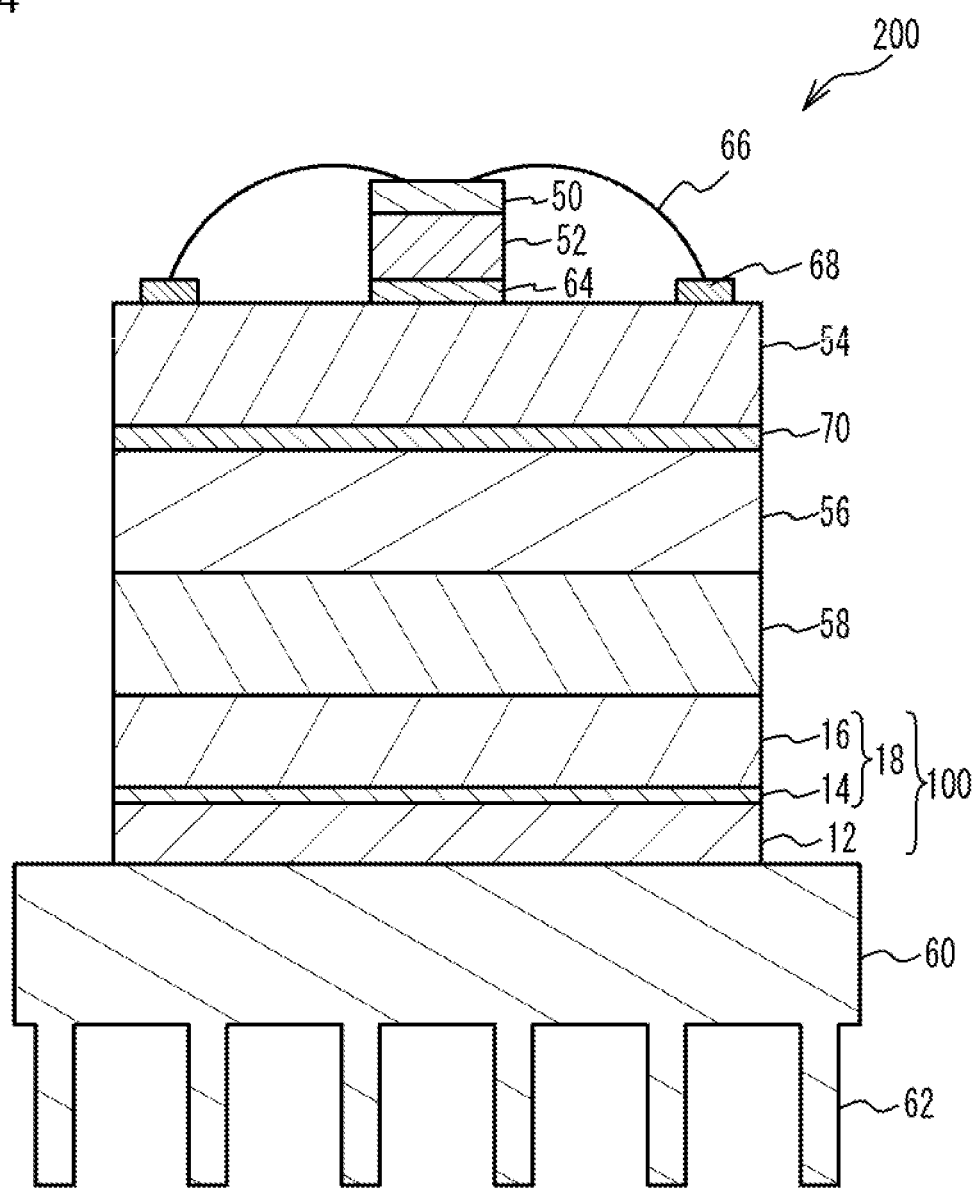
FIG. 4 illustrates an electronic device in accordance with a second embodiment.

FIG. 4 illustrates an electronic device in accordance with a second embodiment. As illustrated in FIG. 4, an electronic device 200 of the second embodiment has an electronic component 50, a solder 52, a mounting substrate 54, a solder 56, a metal base 58, the heat radiation structure 100 of the first embodiment, and a cooling member 60 having fins 62.

The electronic component 50 is a heating component such as a semiconductor element or an IC (Integrated Circuit). The electronic component 50 is such as a high power amplifier for a wireless base station, a semiconductor element for a personal computer, a car IC, or a transistor for motor drive. The electronic component 50 may be other components. The electronic component 50 may be bonded to a metal pattern 64 by the solder 52. The metal pattern 64 is provided on an upper face of the mounting substrate 54 which is a ceramic substrate. The electronic component 50 is electrically coupled with a metal pattern 68 by a wiring 66. The metal pattern 68 is provided on the upper face of the mounting substrate 54 and is used for a signal transmission.

A metal pattern 70 provided on a lower face of the mounting substrate 54 is bonded to the metal base 58 by the solder 56. The metal base 58 is made of a metal having a high thermal conductivity such as copper or aluminum. A thickness of the metal base 58 is, for example, approximately a few millimeters.

The metal base 58 is directly bonded to the upper face of the t-BN layer 16 acting as a part of the heat radiation structure 100. The metal layer 12 acting as a part of the heat radiation structure 100 is directly bonded to the cooling member 60. The cooling member 60 is made of a metal having a high thermal conductivity such as copper or aluminum. Thermal conductive paste such as metal nano paste may be provided between the heat radiation structure 100 and the metal base 58 and between the metal base 58 and the cooling member 60.

Heat generated in the electronic component 50 is radiated to the cooling member 60 via the solder 52, the mounting substrate 54, the solder 56, the metal base 58 and the heat radiation structure 100. The heat radiation structure 100 has favorable heat radiation performance, because the h-BN layer 14 is provided on the main face of the metal layer 12, and the t-BN layer 16 is provided on the main face of the h-BN layer 14 which is opposite to the metal layer 12. Therefore, the heat generated in the electronic component 50 is favorably radiated to the cooling member 60.

In this manner, the electronic device 200 of the second embodiment has the electronic component 50 and the heat radiation structure 100 that is thermally coupled with the electronic component 50. The heat radiation performance of the heat radiation structure 100 is improved as described in the first embodiment. It is therefore possible to favorably radiate the heat generated in the electronic component 50, in the second embodiment.

In the second embodiment, the cooling member 60 is an air-cooled type structure in which the fins 62 are provided. However, another cooling structure in which coolant water flows under the cooling member 60 may be used.

Third Embodiment

Figure 5:
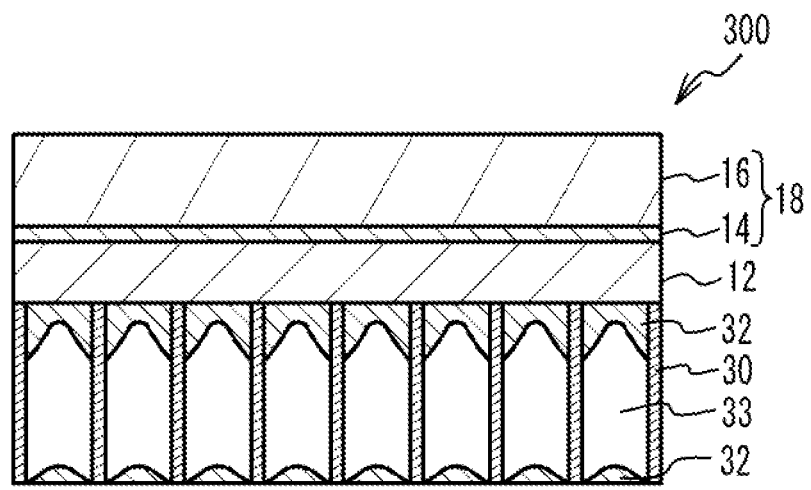
FIG. 5 illustrates a cross sectional view of a heat radiation structure in accordance with a third embodiment.

FIG. 5 illustrates a cross sectional view of a heat radiation structure in accordance with a third embodiment. As illustrated in FIG. 5, a heat radiation structure 300 of the third embodiment has a plurality of carbon nano-tubes 30 (hereinafter referred to as CNTs 30), in addition to the metal layer 12, the h-BN layer 14 and the t-BN layer 16. Each one edge of the plurality of CNTs 30 contacts the main face of the metal layer 12 which is opposite to the h-BN layer 14. The plurality of CNTs 30 extend from the main face. The plurality of CNTs 30 may be a single layer carbon nano-tube. The plurality of CNTs 30 may be a multilayer carbon nano tube. The plurality of CNTs 30 have metallic characteristic. However, the plurality of CNTs 30 may have semiconductor characteristic. A length of the plurality of CNTs 30 is larger than a total thickness of the metal layer 12, the h-BN layer 14 and the t-BN layer 16. The length is, for example, approximately 100 μm to 500 μm.

A resin film 32 is provided between the plurality of CNTs 30 on the side of the metal layer 12 and on another side which is opposite to the metal layer 12. The metal layer 12 is bonded to the plurality of CNTs 30 by the resin film 32. The resin film 32 is provided between the plurality of CNTs 30. However, the resin film 32 is not provided on an edge face of the plurality of CNTs 30. Therefore, each one edge of the plurality of CNTs 30 contacts the metal layer 12. A void 33 is formed between the plurality of CNTs 30 and between the resin film 32 on the side of the metal layer 12 and the resin film 32 which is opposite to the metal layer 12. Other structures are the same as those of the heat radiation structure 100 of the first embodiment. Therefore, an explanation of the other structures is omitted. Instead of the resin film 32, heat conductive paste, metal paste or metal nano paste such as copper (Cu) paste or silver (Ag) paste, or solder paste may be used.

Figure 6A:
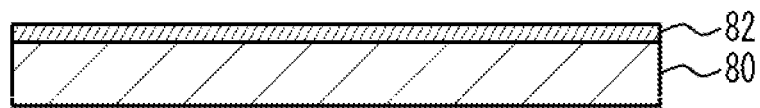
FIG. 6A to FIG. 6D illustrate a cross sectional view for describing a manufacturing method of a heat radiation structure in accordance with a third embodiment.

FIG. 6A to FIG. 7C illustrate a cross sectional view fix describing a manufacturing method of the heat radiation structure in accordance with the third embodiment. A description will be given of a manufacturing method of the plurality of CNTs 30, on the basis of FIG. 6A to FIG. 6D. As illustrated in FIG. 6A, a catalyst metal film 82 is formed on a surface of a substrate 80, by a sputtering method. The substrate 80 may be a semiconductor substrate such as a silicon substrate, an insulation substrate such as an aluminum oxide substrate, a sapphire substrate, a magnesium oxide substrate or a glass substrate, or a metal substrate such as a stainless substrate. A thin film may be formed on the substrate. As an example, a silicon substrate with an oxide film may be used as the substrate 80. The catalyst metal film 82 is, for example, a layer made of iron (Fe), cobalt (Co), nickel (Ni), gold (Au), silver (Ag), or platinum (Pt) or a layer made of an alloy including at least one of the metals. As an example, an iron (Fe) having a thickness of 2.5 nm may be used as the catalyst metal film 82.

A ground layer may be formed between the substrate 80 and the catalyst metal film 82. The ground layer may be a film of molybdenum (Mo), titanium (Ti), hafnium (Hf), zirconium (Zr), niobium (Nb), vanadium (V), tantalum nitride (TaN), titanium suicide (TiSi$_x$), aluminum (Al), aluminum oxide (Al$_2$O$_3$), titanium oxide (TiO$_x$), tantalum (Ta), tungsten (W), copper (Cu), gold (Au) or platinum (Pt), or a film of an alloy including at least one of the metals, or a film of oxide or a film of nitride. The ground layer may have a multilayer structure in which an Al film having a thickness of 15 nm and a Fe film having a thickness of 2.5 nm may be provided in this order on a Ta film having a thickness of 30 nm. The Ta film acts as a barrier layer for suppressing diffusion toward an electrode when the multilayer structure is used even if carbon nano tubes are grown on an electrode such as an Au film or a Pt film.

Figure 6B:
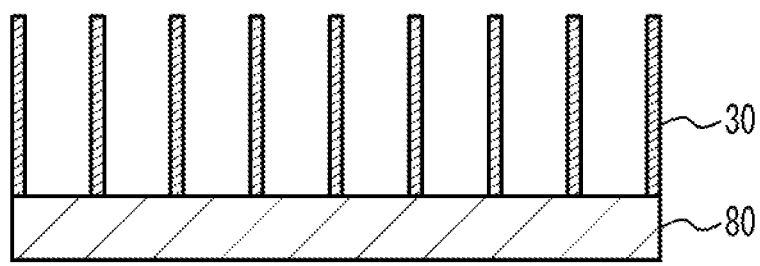

As illustrated in FIG. 6B, the catalyst metal film 82 formed on the surface of the substrate 80 is used as catalyst. Under the condition, the plurality of CNTs 30 that are vertically aligned to the surface of the substrate 80 are formed by a hot filament CVD method. As, one example of the growth condition of the CNT 30, mixed gas of acetylene and argon is used as raw material gas, a temperature of the substrate is 620 degrees C., gas pressure is 1 kPa, and a growth time is 60 minutes. With the growth condition, the plurality of CNTs 30 acting as multilayer carbon nano-tube having a length of 150 nm or the like are formed. When the temperature of the substrate is increased to a growth temperature such as 620 degrees C., the catalyst metal film 82 becomes micro grains. When the raw material gas is flown under the condition, a carbon nano-tube grows from the micro grains. As the growth method of the CNT 30, another method such as a thermal CVD method, a plasma CVD method or a remote plasma CVD method may be used other than the hot filament CVD method. Hydrocarbons such as methane or ethylene may be used other than acetylene, as the carbon material. Alternatively, alcohol such as ethanol or methanol may be used as the carbon material.

Figure 6C:
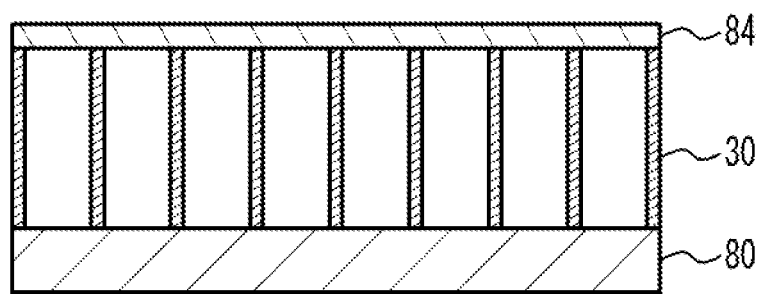
Figure 6D:
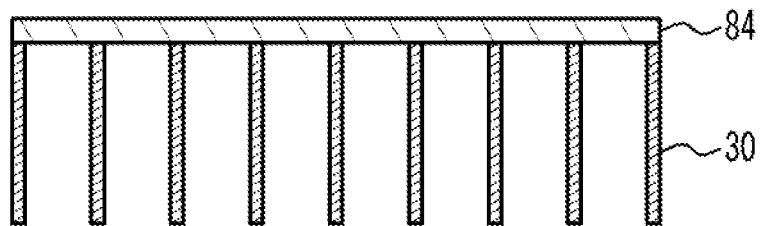

As illustrated in FIG. 6C, a resin sheet 84 is affixed to each one edge of the plurality of CNTs 30 which is opposite to the substrate 80. The resin sheet 84 is a resin sheet which is melted when heated. The resin sheet 84 is, for example, a hot-melt resin such as polyamide, polyurethane or polyolefin, acrylic resin, epoxy resin, silicone resin, polyvinyl resin, or resin wax. As illustrated in FIG. 6D, the plurality of CNTs 30 are peeled from the substrate 80 with use of a razor or the like. Thus, the plurality of CNTs 30 held by the resin sheet 84 are formed.

Figure 7A:
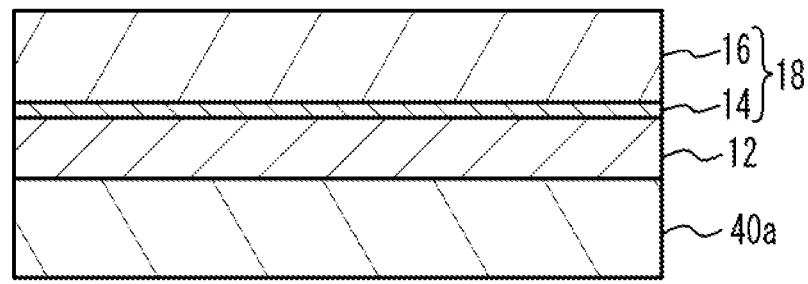
FIG. 7A to FIG. 7C illustrate a cross sectional view fix describing a manufacturing method of a heat radiation structure in accordance with a third embodiment.

As illustrated in FIG. 7A, the metal layer 12, the h-BN layer 14 and the t-BN layer 16 are formed on the main face of a support member 40a by a sputtering method. The support member 40a is a resin sheet which is melted when heated. The support member 40a is, for example, a hot-melt resin such as polyamide, polyurethane or polyolefin, acrylic resin, epoxy resin, silicone resin, polyvinyl resin, or resin wax. For example, the material of the support member 40a is the same as that of the resin sheet 84. The metal layer 12, the h-BN layer 14 and the t-BN layer 16 are formed by the same method as the first embodiment. Therefore, an explanation of the method is omitted. It is preferable that the support member 40a made of the resin sheet has heat resistance performance of 100 degrees C. or more, during the forming of the metal layer 12, the h-BN layer 14 and the t-BN layer 16 by a sputtering method.

Figure 7B:
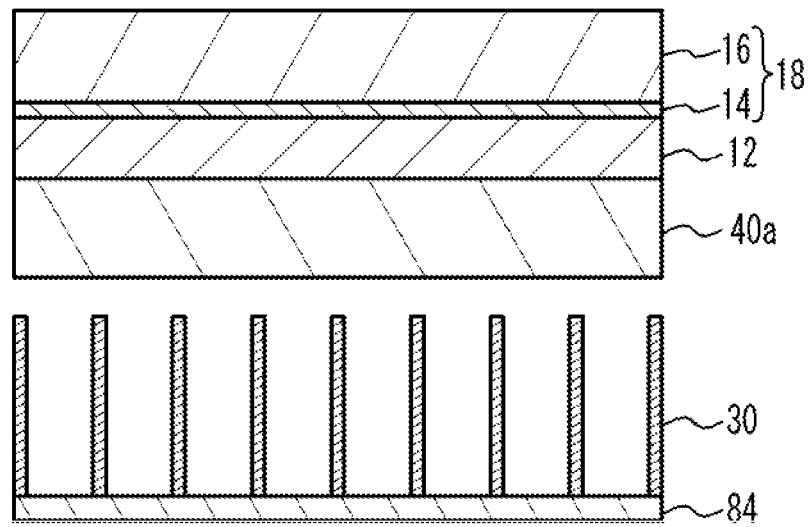

As illustrated in FIG. 7B, the support member 40a is provided on an edge side of the plurality of CNT 30 manufactured by the processes of FIG. 6A to FIG. 6D which is opposite to the resin sheet 84.

Figure 7C:
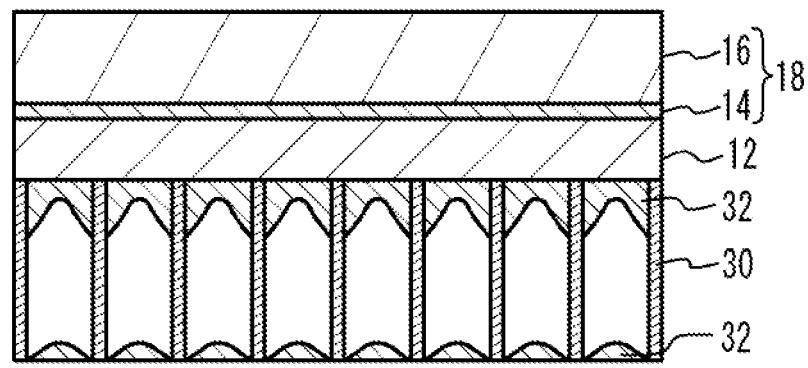

As illustrated in FIG. 7C, the resin for the support member 40a and the resin for the resin sheet 84 are melted when the support member 40a and the resin sheet 84 are pressed to the plurality of CNTs 30 and are heated. The resin is impregnated into between the plurality of CNTs 30 by capillarity phenomenon. Thus, the metal layer 12 contacts each one edge of the plurality of CNTs 30. As an example, the support member 40a and the resin sheet 84 are pressed toward the CNTs 30 with force of 160 N and is heated to 175 degrees C. The resin is hardened when the temperature thereof decreases. Thus, the resin film 32 is formed between the plurality of CNTs 30. The metal layer 12 is bonded to the plurality of CNTs 30 by the resin film 32. Instead of the resin film 32, heat conductive paste, metal paste or metal nano paste such as copper (Cu) paste or silver (Ag) paste, or solder paste may be used.

In the second embodiment illustrated in FIG. 4, due to heat history, stress may occur in the heat radiation structure 100 which is positioned between the metal base 58 and the cooling member 60, when the thermal expansion co-efficient of the metal base 58 is different from that of the cooling member 60. When the stress occurs in the heat radiation structure 100, a crack may occur in the BN layer 18 acting as a part of the heat radiation structure 100 or the h-BN layer 14 may be peeled in a shape of a layer. On the other hand, in the third embodiment, as illustrated in FIG. 5, the plurality of CNTs 30 are connected to the main face of the metal layer 12 which is opposite to the h-BN layer 14. The CNT 30 has high thermal conductivity (thermal conductivity of a carbon nano tube is 1500 W/m·K or the like) and is flexible. Therefore, the stress in the heat radiation structure 300 is suppressed by the CNTs 30, when the heat radiation structure 300 of the third embodiment is provided between the metal base 58 and the cooling member 60. It is therefore possible to suppress the crack or the peeling in the heat radiation structure 300.

It is preferable that the CNT 30 is long because stress generated in the heat radiation structure 300 by the CNT 30 is suppressed. It is preferable that the length of the CNT 30 is larger than the total thickness of the metal layer 12, the h-BN layer 14 and the t-BN layer 16. It is preferable that the length of the CNT 30 is 100 μm or more and 500 μm or less. It is more preferable that the length of the CNT 30 is 200 μm or more and 500 μm or less.

Figure 8:
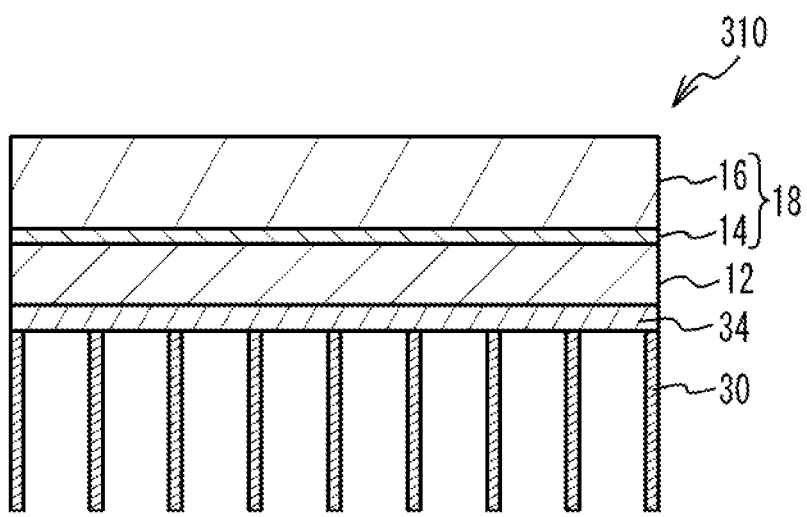
FIG. 8 illustrates a cross sectional view of a heat radiation structure in accordance with a first modified embodiment of a third embodiment.

FIG. 8 illustrates a cross sectional view of a heat radiation structure in accordance with a first modified embodiment of the third embodiment. As illustrated in FIG. 8, in a heat radiation structure 310 of the first modified embodiment of the third embodiment, the resin film 32 is not provided between the plurality of CNTs 30. The metal layer 12 is bonded to the plurality of CNTs 30 by heat conductive paste 34 positioned between the metal layer 12 and the plurality of CNTs 30. The heat conductive paste 34 is, for example, metal paste or metal nano paste such as copper (Cu) paste or silver (Ag) paste, or a solder paste. Other structures are the same as those of the heat radiation structure 300 of the third embodiment. Therefore, an explanation of the structures is omitted.

Figure 9A:
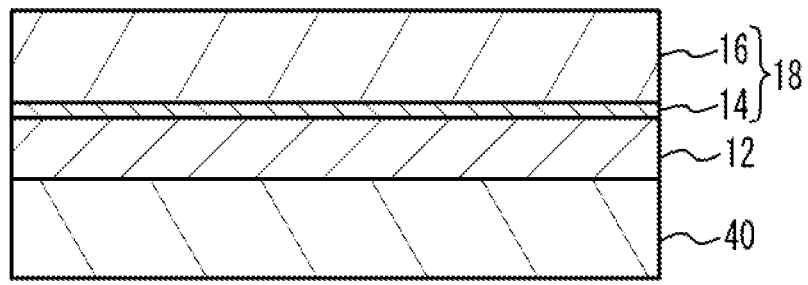
FIG. 9A to FIG. 9D illustrate a cross sectional view for describing a manufacturing method of a heat radiation structure of a first modified embodiment of third embodiment.

FIG. 9A to FIG. 9D illustrate a cross sectional view for describing a manufacturing method of the heat radiation structure of the first modified embodiment of the third embodiment. As illustrated in FIG. 9A, the metal layer 12, the h-BN layer 14 and the t-BN layer 16 are formed on the main face of the support member 40 which is a silicon substrate with an oxide film, by a sputtering method. The metal layer 12, the h-BN layer 14 and the t-BN layer 16 are formed by the same method as the first embodiment. Therefore, an explanation of the method is omitted.

Figure 9B:
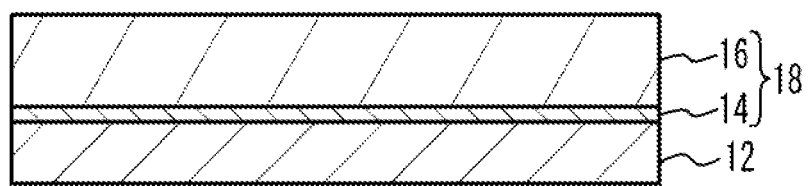

As illustrated in FIG. 9B, the oxide'film of the silicon substrate acting as the support member 40 is removed by etching with use of hydrofluoric acid. Thus, lamination films including the metal layer 12, the h-BN layer 14 and the t-BN layer 16 are peeled from the support member 40. Thus, the main face of the metal layer 12 opposite to the h-BN layer 14 is exposed.

Figure 9C:
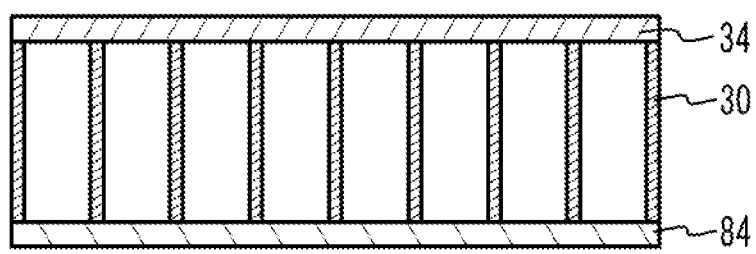

As illustrated in FIG. 9C, the heat conductive paste 34 is coated on edges of the plurality of CNTs 30 manufactured by the processes of FIG. 6A to FIG. 6D which are opposite to the resin sheet 84.

Figure 9D:
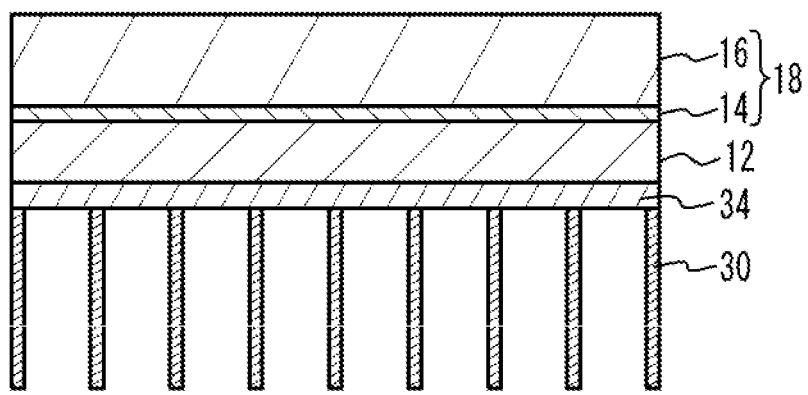

As illustrated in FIG. 9D, the main face of the metal layer 12 which is opposite to the h-BN layer 14 is affixed to the heat conductive paste 34. Thus, edges of the plurality of CNT 30 are connected to the metal layer 12. Thus, the metal layer 12 is bonded to the plurality of CNTs 30 by the heat conductive paste 34. The metal layer 12 may be bonded to the heat conductive paste 34 by a normal temperature crimping or thermal crimping. After that, the resin sheet 84 is peeled from the plurality of CNTs 30.

In FIG. 9C, the heat conductive paste 34 is coated on the edges of the plurality of CNTs 30. However, the heat conductive paste 34 has only to be coated on at least one of the edges of the plurality of CNTs 30 and the main face of the metal layer 12 which is opposite to the h-BN layer 14.

As in the case of the heat radiation structure 300 of the third embodiment, the metal layer 12 may be bonded to the plurality of CNTs 30 by the resin film 32 positioned between the plurality of CNTs 30. As in the case of the heat radiation structure 310 of the first modified embodiment of the third embodiment, the metal layer 12 may be bonded to the plurality of CNTs 30 by the heat conductive paste 34 positioned between the metal layer 12 and the plurality of CNTs 30.

In the third embodiment, as illustrated in FIG. 7A to FIG. 7C, the support member 40a is provided on one edge of the plurality of CNTs 30. After that, the resin for the support member 40a is melted and impregnated into between the plurality of CNTs 30. Thus, the metal layer 12 is connected to the one edge of the plurality of CNTs 30. In this case, the support member 40a for forming the metal layer 12, the h-BN layer 14 an the t-BN layer 16 acts as the resin film 32 for bonding the metal layer 12 and the CNTs 30. Therefore, the heat conductive paste 34 of the first modified embodiment of the third embodiment may not be necessarily used.

In the first modified embodiment of the third embodiment, as illustrated in FIG. 9A to FIG. 9D, the heat conductive paste 34 is coated on at least one of the main face of the metal layer 12 exposed by removing of the support member 40 and the one edge of the plurality of CNTs 30. And, the one edge of the plurality of CNTs 30 is bonded to the main face of the metal layer 12 by the heat conductive paste 34. Thus, the metal layer 12 is bonded to the one edge of the plurality of CNTs 30. In the third example, the resin sheet is used as the support member 40a. The h-BN layer 14 is formed on the support member 40a at a temperature lower than the melting temperature of the resin. It is therefore difficult to obtain the h-BN layer 14 having high quality. On the other hand, in the first modified embodiment of the third embodiment, a material other than the resin, such as the silicon substrate with the oxide film is used as the support member 40. Therefore, the h-BN layer 14 is formed on the support member 40 at a high temperature. Therefore, the h-BN layer 14 having high quality can be obtained.

Figure 10B:
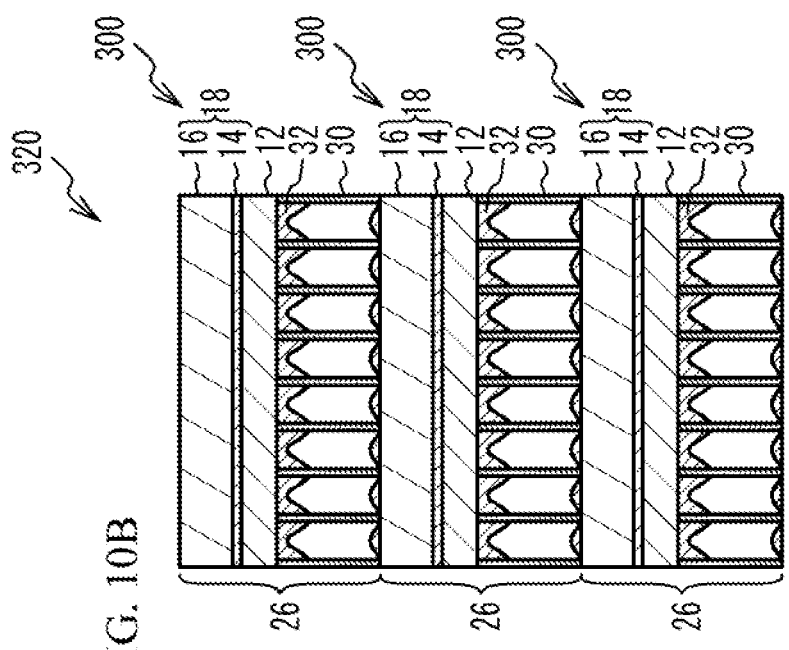
FIG. 10A and FIG. 10B illustrate a cross sectional view for describing a manufacturing method of a heat radiation structure of a second modified embodiment of a third embodiment.
Figure 10A:
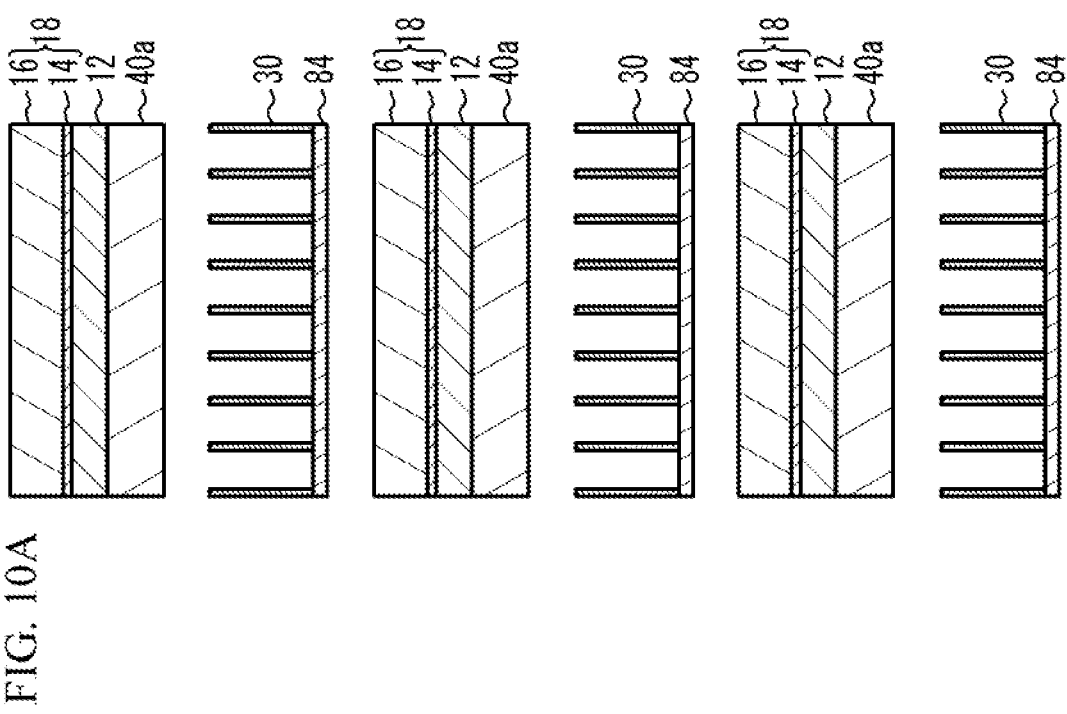

FIG. 10A and FIG. 10B illustrate a cross sectional view for describing a manufacturing method of the heat radiation structure of a second modified embodiment of the third embodiment. As illustrated in FIG. 10A, each of structures in which the plurality of CNTs 30 are held by the resin sheet 84 illustrated in FIG. 6D and each of structures in which the metal layer 12 and the BN layer 18 are formed on the support member 40a illustrated in FIG. 7A are alternately stacked. As illustrated in FIG. 10B, the resin for the support member 40a and the resin for the resin sheet 84 are melted when the support member 40a and the resin sheet 84 are pressed to the plurality of CNTs 30 in the stacking direction and are heated. Thus, the stacked structures are bonded by the resin film 32 formed between the plurality of CNTs 30. Thus, a heat radiation structure 320 of the second modified embodiment of the third embodiment is funned. In this manner, in the heat radiation structure 320 of the second modified embodiment of the third embodiment, the heat radiation structure 300 of the third embodiment acts as a single block 26. And, the plurality of blocks 26 are stacked.

As in the case of the heat radiation structure 320 of the second modified embodiment of the third embodiment, the heat radiation structure 300 having the metal layer 12, the h-BN layer 14, the t-BN layer 16 and the plurality of CNTs 30 may act as a single block 26. And, the plurality of blocks 26 may be stacked. In this case, even if a part or all of the h-BN layer 14 and the t-BN layer 16 of one of the blocks 26 is removed, it is possible to secure the insulation performance of the heat radiation structure 320 as a whole.

Figure 11A:
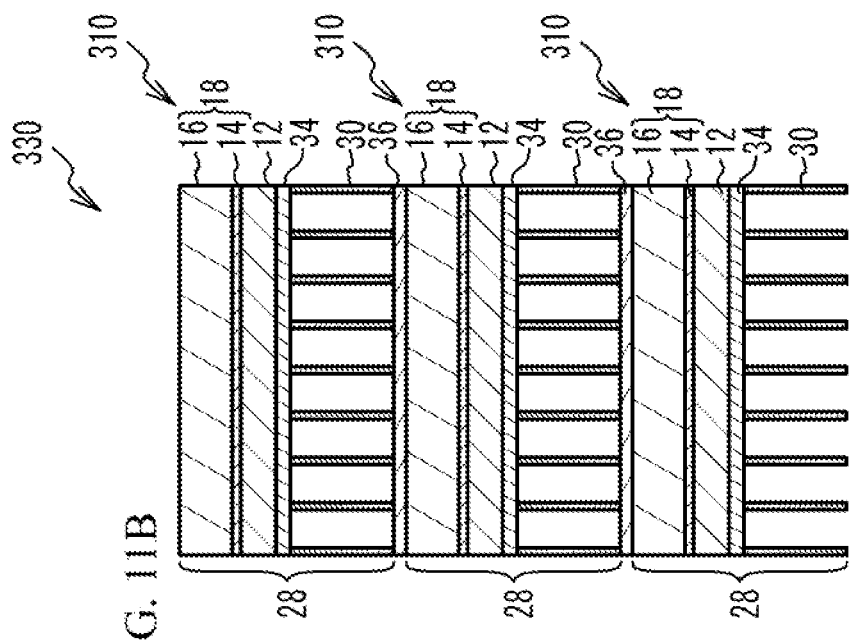
FIG. 11A and FIG. 11B illustrate a cross sectional view of a heat radiation structure of a third modified embodiment of a third embodiment.
Figure 11B:
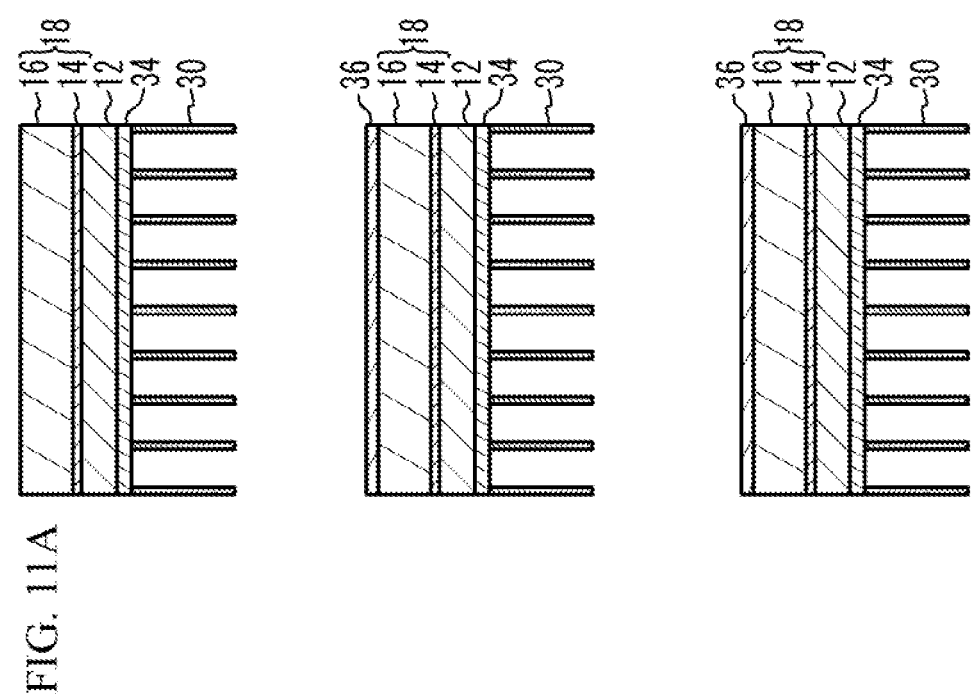

FIG. 11A and FIG. 11B illustrate a cross sectional view of the heat radiation structure of a third modified embodiment of the third embodiment. As illustrated in FIG. 11A, the plurality of heat radiation structures 310 of the first modified embodiment of the third embodiment are formed. After that, heat conductive paste 36 is coated on a surface of the t-BN layer 16 of a part of the heat radiation structures 310. As illustrated in FIG. 11B, the plurality of heat radiation structures 310 are bonded by the heat conductive paste 36. Thus, a heat radiation structure 330 of the third modified embodiment of the third embodiment is formed. In this manner, in the heat radiation structure 330 of the third modified embodiment of the third embodiment, the heat radiation structure 310 of the first modified embodiment of the third embodiment acts as a single block 28. And, the plurality of blocks 28 are stacked.

In the heat radiation structure 330 of the third modified embodiment of the third embodiment, it is possible to achieve the insulation performance as the whole of the heat radiation structure 330, even if a part or all of the h-BN layer 14 and the t-BN layer 16 in one of the blocks 28 is removed as well as the heat radiation structure 320 of the second modified embodiment of the third embodiment.

Fourth Embodiment

Figure 12:
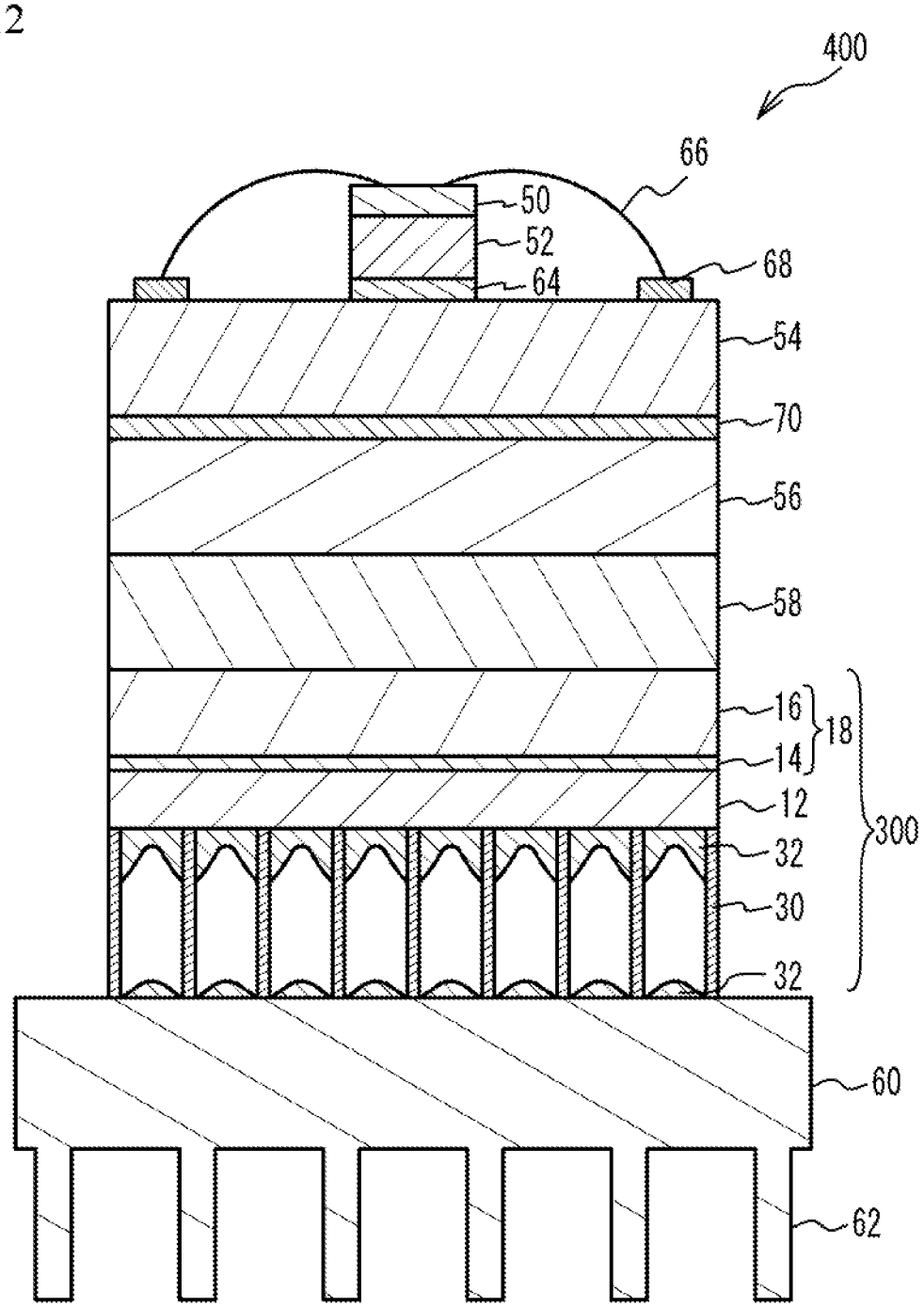
FIG. 12 illustrates a cross sectional view of an electronic device in accordance with a fourth embodiment.

FIG. 12 illustrates a cross sectional view of an electronic device in accordance with a fourth embodiment. As illustrated in FIG. 12, an electronic device 400 in accordance with the fourth embodiment has the heat radiation structure 300 of the third embodiment instead of the heat radiation structure 100 of the first embodiment, between the metal base 58 and the cooling member 60. The upper face of the t-BN layer 16 acting as a part of the heat radiation structure 300 contacts the metal base 58. The edge of the plurality of CNTs 30 which is opposite to the metal layer 12 contacts the cooling member 60. Other structure are the same as those of the second embodiment. Therefore, an explanation of the other structures is omitted.

As in the case of the fourth embodiment, the heat radiation structure 300 may be provided between the metal base 58 and the cooling member 60, instead of the heat radiation structure 100. The heat radiation performance of the heat radiation structure 300 is improved, as well as the heat radiation structure 100. It is therefore possible to favorably radiate the heat generated in the electronic component 50. Moreover, the stress is suppressed by the CNT 30. It is therefore possible to suppress a crack and peeling of the heat radiation structure 300. In the fourth embodiment, the heat radiation structure 300 of the third embodiment is provided between the metal base 58 and the cooling member 60. However, one of the heat radiation structures of the first modified embodiment of the third embodiment, the second modified embodiment of the third embodiment and the third modified embodiment of the third embodiment may be provided. In this case, the same effect is achieved.

Fifth Embodiment

Figure 13:
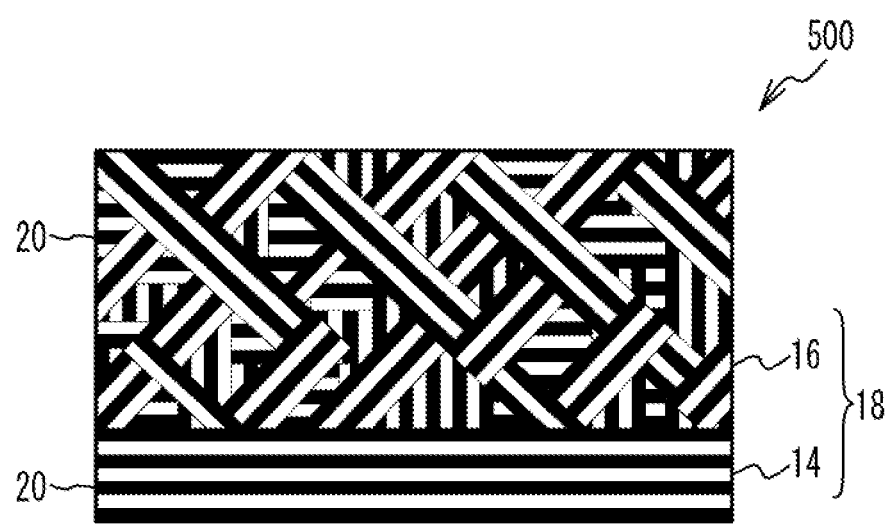
FIG. 13 illustrates a cross sectional view of a heat radiation structure in accordance with a fifth embodiment.

FIG. 13 illustrates a cross sectional view of a heat radiation structure in accordance with a fifth embodiment. As well as FIG. 1 of the first embodiment, FIG. 13 schematically illustrates the board-shaped structure 20 forming the hexagonal boron nitride layers and the turbostratic structure boron nitride layers. As illustrated in FIG. 13, a heat radiation structure 500 in accordance with the fifth embodiment is different from the heat radiation structure 100 of the first embodiment illustrated in FIG. 1, in a point that the metal layer 12 is not provided. Other structures are the same as those of the first embodiment. Therefore, an explanation of the other structures is omitted. It is possible to manufacture the heat radiation structure 500 of the fifth embodiment by the manufacturing method of the heat radiation structure 100 of the first embodiment illustrated in FIG. 2A to FIG. 2C. However, the manufacturing method of the fifth embodiment is different from the manufacturing method of the first embodiment, in a part of the process of FIG. 2C. In the fifth embodiment, in FIG. 2C, the support member 40 and the metal layer 12 are etched and removed by acid such as iron chloride. Thus, the BN layer 18 including the h-BN layer 14 and the t-BN layer 16 are peeled from the support member 40 and the metal layer 12. Thus, the heat radiation structure 500 of the fifth embodiment is obtained.

The beat radiation structure 500 of the fifth embodiment includes the h-BN layer 14 and the t-BN layer 16 provided on the main face of the h-BN layer 14. It is therefore possible to improve the heat radiation performance, as well as the first embodiment.

Sixth Embodiment

Figure 14:
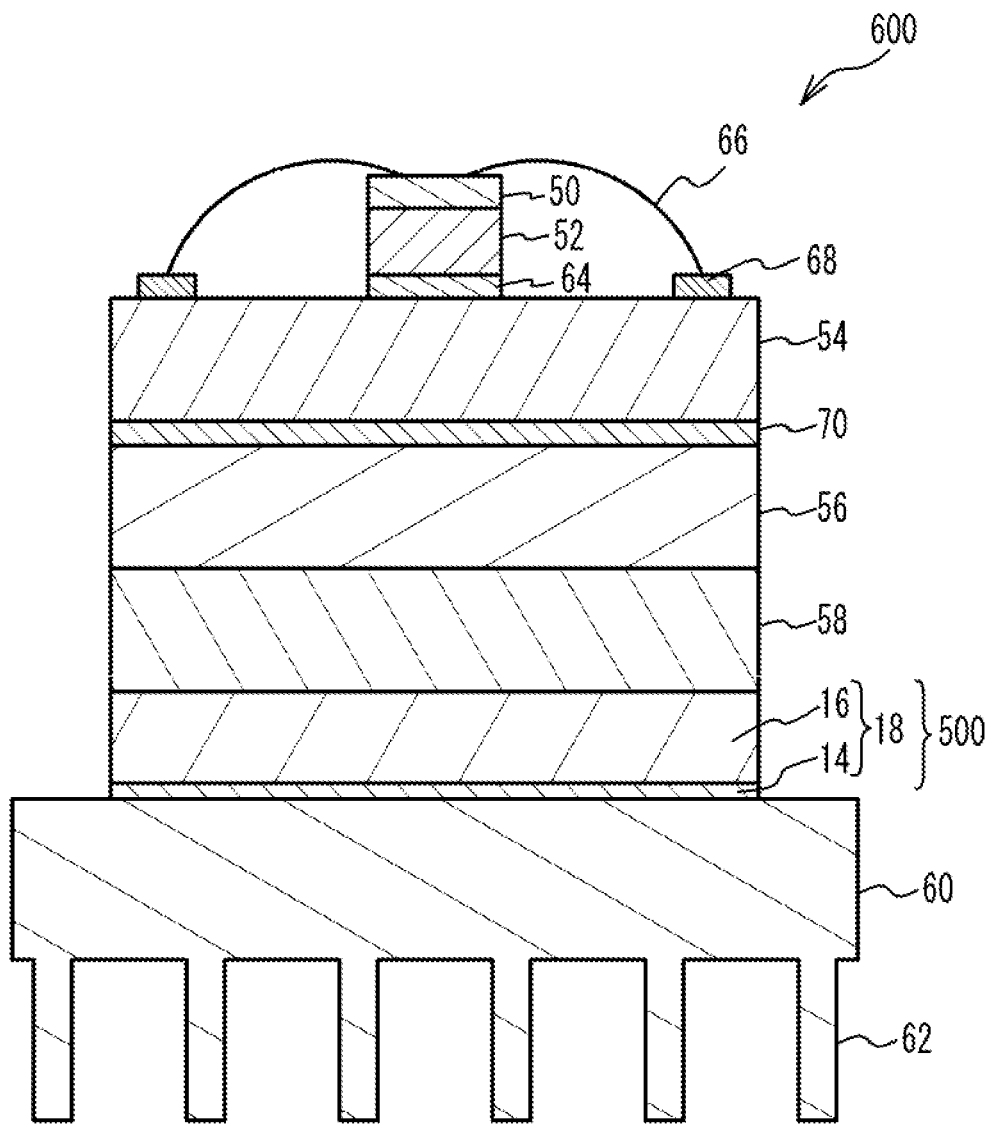
FIG. 14 illustrates a cross sectional view of an electronic device in accordance with a sixth embodiment.

FIG. 14 illustrates a cross sectional view of an electronic device in accordance with a sixth embodiment. As illustrated in FIG. 14, an electronic device 600 in accordance with the sixth embodiment has the heat radiation structure 500 instead of the heat radiation structure 100 of the first embodiment, between the metal base 58 and the cooling member 60. The upper face of the t-BN layer 16 acting as a part of the heat radiation structure 500 contacts the metal base 58. The lower face of the h-BN layer 14 contacts the cooling member 60. Heat conductive paste such as metal nano paste may be provided between the heat radiation structure 500, and the metal base 58 and the cooling member 60. Other structure are the same as those of the second embodiment. Therefore, an explanation of the other structures is omitted.

As in the case of the sixth embodiment, the heat radiation structure 500 may be provided between the metal base 58 and the cooling member 60, instead of the heat radiation structure 100. The heat radiation performance of the beat radiation structure 500 is improved, as well as the heat radiation structure 100. It is therefore possible to favorably radiate the heat generated in the electronic component 50.

Seventh Embodiment

Figure 15:
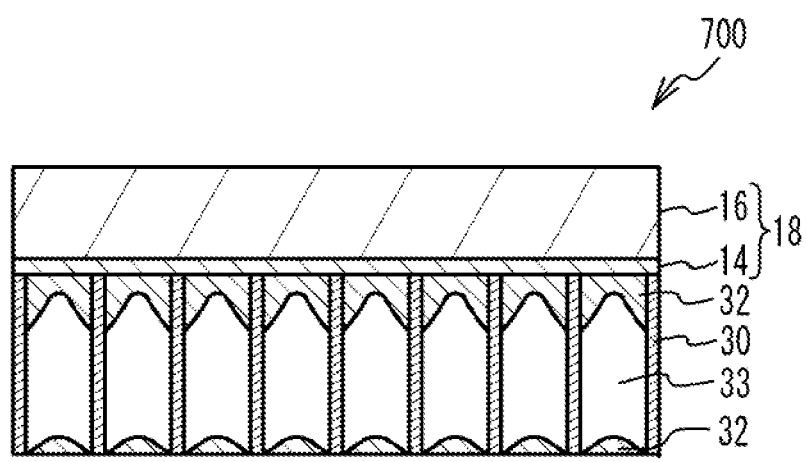
FIG. 15 illustrates a cross sectional view of a beat radiation structure in accordance with a seventh embodiment.

FIG. 15 illustrates a cross sectional view of a heat radiation structure in accordance with a seventh embodiment. As illustrated in FIG. 15, a heat radiation structure 700 in accordance with the seventh embodiment is different from the heat radiation structure 300 of the third embodiment in a point that the metal layer 12 is not provided. Other structure are the same as those of the third embodiment. Therefore, an explanation of the other structures is omitted. It is possible to form the heat radiation structure 700 of the seventh embodiment by the manufacturing method of the beat radiation structure 300 of the third embodiment described on the basis of FIG. 6A to FIG. 7C.

In the heat radiation structure 300 of the third embodiment, the metal layer 12 is provided between the BN layer 18 and the CNTs 30. However, as in the case of the heat radiation structure 700 of the seventh embodiment, the metal layer 12 may not be necessarily provided between the BN layer 18 and the CNTs 30. In this case, it is possible to suppress a crack and peeling in the heat radiation structure 700, as well as the heat radiation structure 300 of the third embodiment.

The beat radiation structure 700 of the seventh embodiment may have a structure in which the BN layer 18 is bonded to the CNTs 30 by the heat conductive paste 34 without the resin film 32, as well as the first modified embodiment of the third embodiment. A plurality of the heat radiation structures 700 may be stacked, as well as the second modified embodiment and the third modified embodiment of the third embodiment.

Eighth Embodiment

Figure 16:
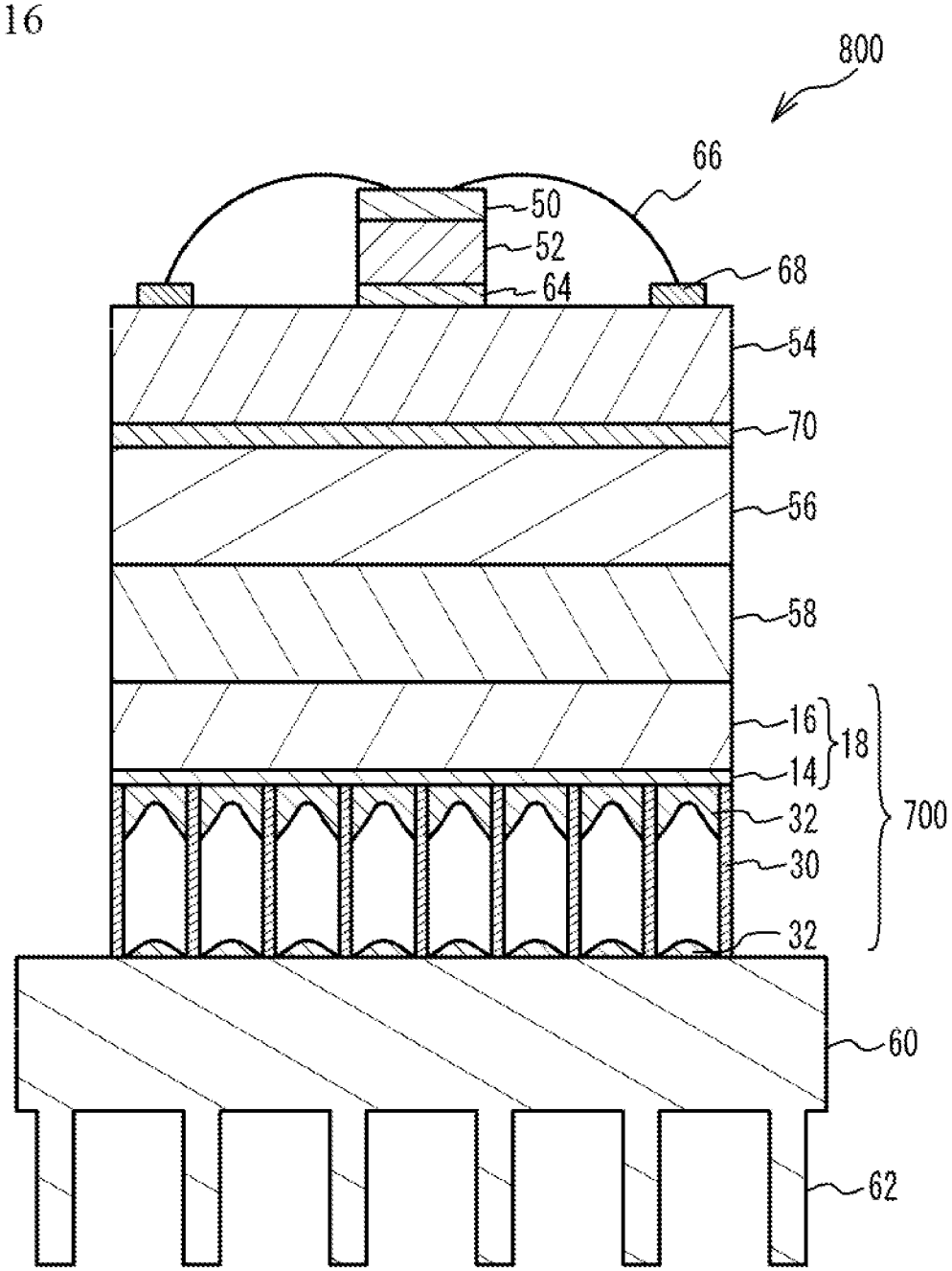
FIG. 16 illustrates a cross sectional view of an electronic device in accordance with an eighth, embodiment.

FIG. 16 illustrates a cross sectional view of an electronic device in accordance with an eighth embodiment. As illustrated in FIG. 16, an electronic device 800 in accordance with the eighth embodiment has the heat radiation structure 700 instead of the heat radiation structure 100 of the first embodiment, between the metal base 58 and the cooling member 60. Other structure are the same as those of the second embodiment. Therefore, an explanation of the other structures is omitted.

As in the case of the eighth embodiment, the heat radiation structure 700 may be provided between the metal base 58 and the cooling member 60, instead of the heat radiation structure 100. The heat radiation performance of the heat radiation structure 700 is improved, as well as the heat radiation structure 100. It is therefore possible to favorably radiate the heat generated in the electronic component 50. Moreover, the stress is suppressed by the CNTs 30. It is therefore possible to suppress a crack and peeling in the heat radiation structure 700.

All examples and conditional language recited herein are intended for pedagogical purposes to aid the reader in understanding the invention and the concepts contributed by the inventor to furthering the art, and are to be construed as being, without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A heat radiation structure comprising:
a hexagonal boron nitride layer; and
a turbostratic structure boron nitride layer provided on a first surface of the hexagonal boron nitride layer; wherein
the hexagonal boron nitride layer has a layered structure in which a board-shaped structure are regularly stacked, the board-shape structure having a structure in which a plurality of six-membered cyclic structure, in which boron atoms and nitrogen atoms are alternately bonded, are two-dimensionally coupled, and
the turbostratic structure boron nitride layer has a polycrystalline structure in which a plurality of units are randomly stacked, each of the units having a structure in which one or more of the board-shape structures are regularly stacked.

2. The heat radiation structure as claimed in claim 1, further comprising:
a metal layer provided on a second surface of the hexagonal boron nitride layer.

3. A heat radiation structure comprising:
a hexagonal boron nitride layer;
a turbostratic structure boron nitride layer provided on a first surface of the hexagonal boron nitride layer;
a metal layer provided on a second surface of the hexagonal boron nitride layer, and
a plurality of carbon nano-tubes,
wherein edges of the plurality of carbon nanotubes are connected to a first surface of the metal layer,
wherein the first surface of the metal layer does not contact with the second surface of the hexagonal boron nitride layer.

4. The heat radiation structure as claimed in claim 3, wherein the metal layer is bonded to the plurality of carbon nano-tubes by a resin film positioned between the plurality of carbon nano-tubes.

5. The heat radiation structure as claimed in claim 3, wherein the metal layer is bonded to the plurality of carbon nano-tubes by heat conductive paste positioned between the metal layer and the plurality of carbon nano-tubes.

6. The heat radiation structure as claimed in claim 3, wherein each of lengths of the plurality of carbon nano-tubes is larger than a total thickness of the metal layer, the hexagonal boron nitride layer and the turbostratic structure boron nitride layer.

7. The heat radiation structure as claimed in claim 3, wherein a plurality of blocks are stacked, wherein each of the plurality of blocks includes the metal layer, the hexagonal boron nitride layer, the turbostratic structure boron nitride layer and the plurality of carbon nano-tubes.

8. The heat radiation structure as claimed in claim 2, wherein the metal layer includes at least one of iron, cobalt, nickel, gold, silver, platinum and an alloy thereof.

9. A heat radiation structure comprising:
a hexagonal boron nitride layer;
a turbostratic structure boron nitride layer provided on a first surface of the hexagonal boron nitride layer; and
a plurality of carbon nano-tubes,
wherein edges of the plurality of carbon nano-tubes are connected to a second surface of the hexagonal boron nitride layer.

10. The heat radiation structure as claimed in claim 9, wherein the hexagonal boron nitride layer is bonded to the plurality of carbon nano-tubes by a resin film positioned between the plurality of carbon nano-tubes.

11. The heat radiation structure as claimed in claim 9, wherein the hexagonal boron nitride layer is bonded to the plurality of carbon nano-tubes by heat conductive paste positioned between the hexagonal boron nitride layer and the plurality of carbon nanotubes.

12. The heat radiation structure as claimed in claim 1, wherein the turbostratic structure boron nitride layer is thicker than the hexagonal boron nitride layer.

13. An electronic device comprising:
an electronic component; and
a heat radiation structure thermally connected to the electronic component,
wherein the heat radiation structure includes: a hexagonal boron nitride layer; and a turbostratic structure boron nitride layer provided on a first surface of the hexagonal boron nitride layer,
wherein the hexagonal boron nitride layer has a layered structure in which a board-shaped structure are regularly stacked, the board-shape structure having a structure in which a plurality of six-membered cyclic structure, in which boron atoms and nitrogen atoms are alternately bonded, are two-dimensionally coupled, and
wherein the turbostratic structure boron nitride layer has a polycrystalline structure in which a plurality of units are randomly stacked, each of the units having a structure in which one or more of the board-shape structures are regularly stacked.

14. The electronic device as claimed in claim 13, further comprising:
a metal layer provided on a second surface of the hexagonal boron nitride layer.

15. An electronic device comprising:
an electronic component; and
a heat radiation structure thermally connected to the electronic component,
wherein the heat radiation structure includes: a hexagonal boron nitride layer, and a turbostratic structure boron nitride layer provided on a first surface of the hexagonal boron nitride layer,
wherein the electronic component sandwiches the turbostratic structure boron nitride layer with the hexagonal boron nitride layer.

* * * * *